United States Patent [19]
Taylor et al.

[11] Patent Number: 5,652,534
[45] Date of Patent: Jul. 29, 1997

[54] PRECISION DIGITAL PHASE SHIFTER

[75] Inventors: Stephen D. Taylor, Agoura; Steve I. Hsu, Rancho Palos Verdes; Howard S. Nussbaum, Los Angeles; William P. Posey, Palos Verdes Estates, all of Calif.

[73] Assignee: Hughes Aircraft Company, Los Angeles, Calif.

[21] Appl. No.: 576,328

[22] Filed: Dec. 21, 1995

[51] Int. Cl.$^6$ ........................................... H03D 3/02
[52] U.S. Cl. .................. 327/237; 327/231; 327/115; 327/117; 377/48
[58] Field of Search .......................... 327/100, 113, 327/114, 115, 117, 231, 241, 237; 377/47, 48, 52, 107, 109; 364/703

[56] References Cited

U.S. PATENT DOCUMENTS

| | | | |
|---|---|---|---|
| 4,560,960 | 12/1985 | Chanrion | 331/178 |
| 4,891,774 | 1/1990 | Bradley | 364/703 |
| 4,991,187 | 2/1991 | Herold et al. | 377/48 |

*Primary Examiner*—Timothy P. Callahan
*Attorney, Agent, or Firm*—Leonard A. Alkov; Wanda K. Denson-Low

[57] ABSTRACT

A phase shifter that employs digital circuitry to achieve arbitrarily fine phase control of reference signals at frequencies extending to the Gigahertz region. The phase shifter includes a cascade of identical phase shift units that provide progressively finer phase control resolution over a full 360 degree range. The phase precision is set by the number of stages used.

26 Claims, 5 Drawing Sheets

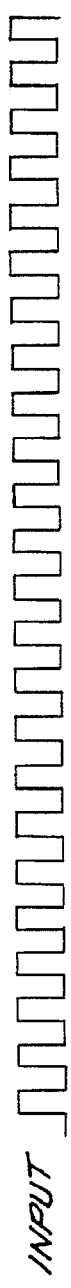
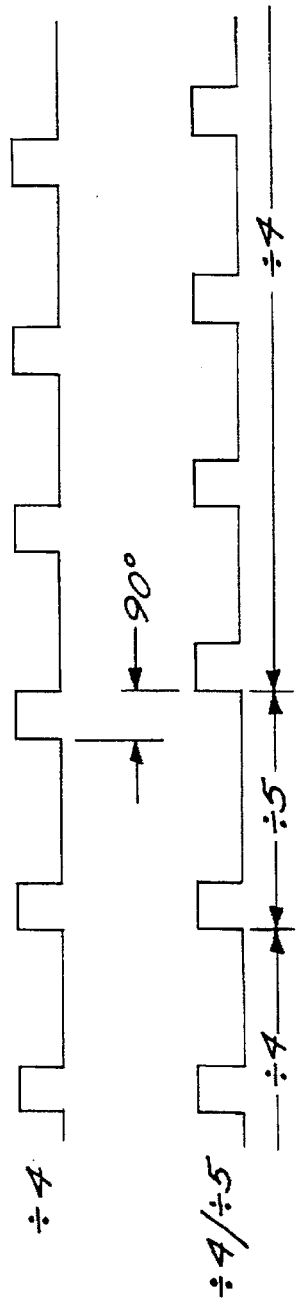
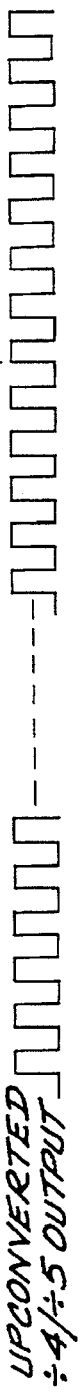
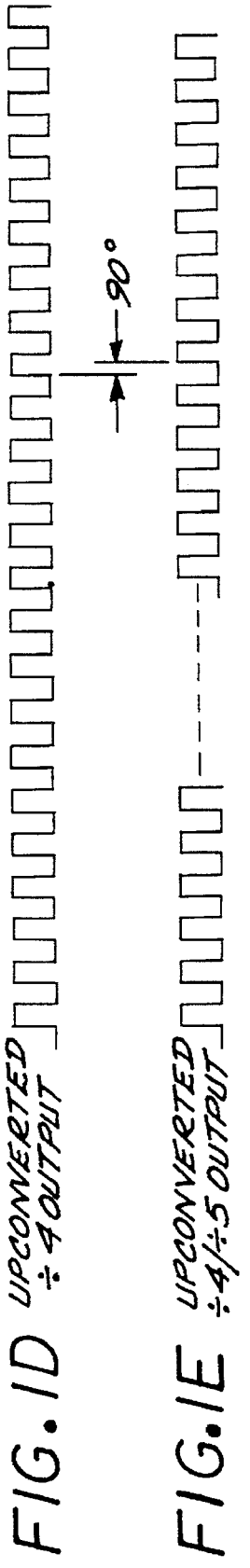
FIG. 1A INPUT
FIG. 1B ÷4
FIG. 1C ÷4/÷5
FIG. 1D UPCONVERTED ÷4 OUTPUT
FIG. 1E UPCONVERTED ÷4/÷5 OUTPUT

FIG. 2A INPUT
FIG. 2B ÷4
FIG. 2C ÷4/÷5
FIG. 2D UPCONVERTED ÷4 OUTPUT
FIG. 2E UPCONVERTED ÷4/÷5 OUTPUT

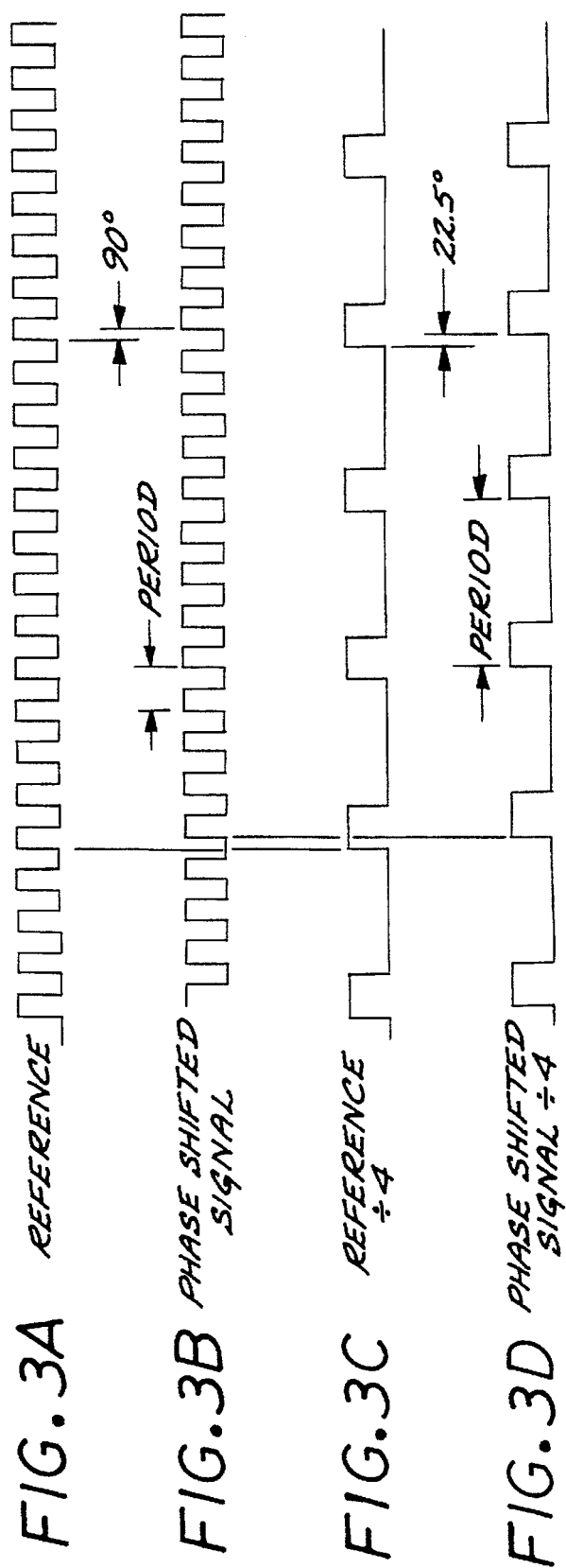

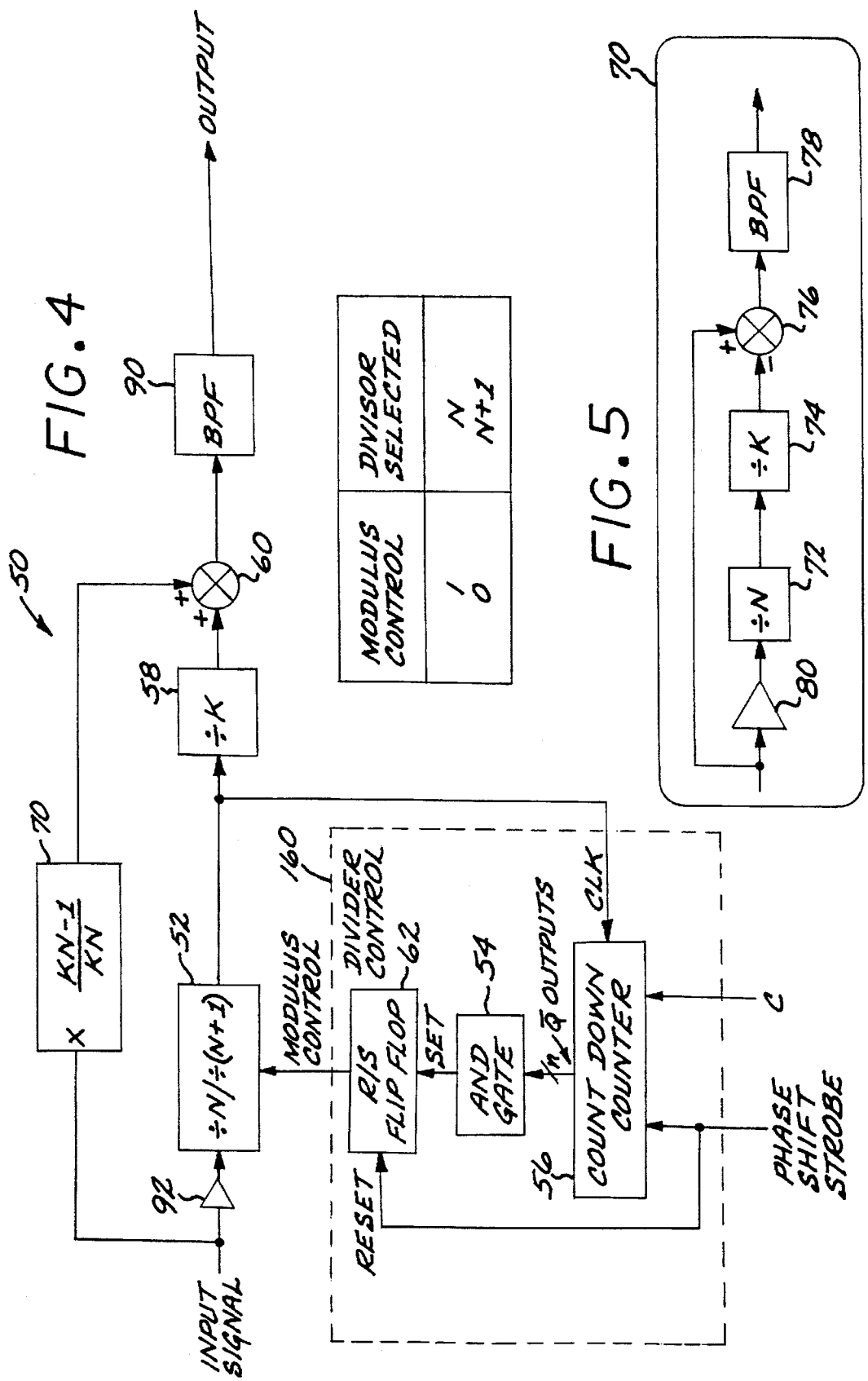

PRECISION DIGITAL PHASE SHIFTER

This invention was made with Government support under contract FC2J (Cyclops) awarded by the Government. The Government has certain rights in this invention.

CROSS-REFERENCE TO RELATED APPLICATIONS

This application is related to the following co-pending, commonly assigned applications: DIGITAL FREQUENCY DIVIDER PHASE SHIFTER, S. I. Hsu et al, Ser. No.08/576,329, filed Dec. 21, 1995; DISCRETE PHASE MODULATOR, H. S. Nussbaum et al., Ser. No. 08/576,325, filed Dec. 21, 1995; SYSTEM AND METHOD FOR RADAR RECEIVER HARMONIC DISTORTION AND SPURIOUS RESPONSE CONTROL, W. P. Posey et al., Ser. No. 08/576,327, filed Dec. 21, 1995; PRECISION DIGITAL PHASE SHIFT ELEMENT, S. D. Taylor et al., Ser. No. 08/576,330, filed Dec. 21, 1995; and DIGITAL COUNTER AND COMPARATOR BASED PRECISION PHASE SHIFT ELEMENT, S. D. Taylor et al., Ser. No. 08/576,326, filed Dec. 21, 1995; the entire contents of these co-pending applications are incorporated herein by this reference.

TECHNICAL FIELD OF THE INVENTION

This invention relates to the field of RF phase shifters, and more particularly to phase shifters employing digital circuitry to achieve arbitrarily fine phase control.

BACKGROUND OF THE INVENTION

Certain advanced radar systems under development require noise and spurious performance well beyond that of currently fielded systems. The noise and spurious performance of the variable frequency oscillator (VFO) used for Doppler tuning must, in particular, be dramatically improved to be compatible with these applications. While that improvement may be feasible, the simultaneous improvements in noise, spurious signal content and switching speed is viewed as a design risk. Phase tuning rather than frequency tuning can also be used to effect the Doppler tuning.

The prior art for electrically tuned phase shifters is wide and diverse. It includes, analog designs using varactor tuning, switched line lengths, tapped delay lines, vector modulators, n-stage reactively terminated quadrature hybrids, and direct digital synthesizers (DDS). With the exception of the DDS, the phase resolution and accuracy that can be achieved from these approaches is limited by fabrication precision, alignment accuracy, and parasitic effects. The DDS can achieve the phase resolution of the disclosed approach but, without specialized and complex added circuitry, does not provide the spurious signal performance required for radar application.

SUMMARY OF THE INVENTION

A digital phase shifter is described for phase shifting an input signal by increments of 360/NK degrees. The phase shifter includes a dual modulus frequency divider for dividing the frequency of the input signal by a selectable modulus value of N or N+1, wherein N is an integer, the dual modulus frequency divider providing an output signal having a frequency equal to the frequency of the input signal divided by N or N+1. A frequency divider circuit divides the dual modulus frequency divider output signal by a division factor K, wherein the frequency divider provides a frequency divider output signal having a frequency equal to the frequency of the dual modulus frequency divider output divided by K.

The phase shifter further includes upconverting means for upconverting the frequency divider output signal to the frequency of the input signal or other frequency depending on the application need. The upconverting means provides an upconverter signal having a frequency equal to the frequency of the input signal or other frequency as required. A means responsive to a phase control command specifying a phase shift value selects the modulus value of the dual modulus frequency divider. The modulus selecting means is operable to select one of the values, N or N+1, as a primary modulus value for the dual modulus frequency divider, and is further operable to select the other of the values to which the frequency divider is set only for a number of cycles of division of the frequency divider to effect the phase shifting of the input signal. The number of cycles is determined in dependence on the phase control command, wherein the upconverter signal is phase shifted relative to a phase of the input signal by increments of 360/NK degrees.

The upconverting means comprises a mixer for mixing the frequency divider signal with a local oscillator (LO) signal to produce the upconverter signal. A band pass filter filters the upconverter signal to filter out undesirable mixer products.

In accordance with another aspect of the invention, the phase shifter further comprises an LO signal generating circuit comprising means for deriving the LO signal from the input signal. In an exemplary embodiment, the deriving means comprises LO circuit frequency dividing means for dividing the frequency of the input signal by a factor NK to provide an LO frequency divider signal having a frequency equal to the input signal frequency divided by NK, and LO mixing means for mixing the LO frequency divider signal with the input signal to provide an LO mixer output signal.

In one embodiment, the primary modulus value is N, and the modulus value to which the dual modulus frequency divider is set for a number of cycles of division to effect the phase shifting of the input signal is N+1, wherein the phase shifting is a phase retardation of the input signal. In another embodiment, the primary modulus value is N+1, and the modulus value to which the dual modulus frequency divider is set for a number of cycles of division to effect the phase shifting is N, wherein the phase shifting is a phase advancing of the input signal.

According to another aspect of the invention, a multistage digital phase shifter for phase shifting an input signal is describe, comprising a cascaded arrangement of digital phase shift circuit units. Each unit comprises an input port and an output port and providing an output signal which is a digitally phase shifted version of a signal received at the input port, each unit providing phase shifting of signals in increments of 360/NK, where N and K are each integer values, and wherein an output port of a first unit is connected to an input port of a next unit in the cascaded arrangement, so that signals phase shifted by the first unit are propagated through and phase shifted by the next unit.

BRIEF DESCRIPTION OF THE DRAWING

These and other features and advantages of the present invention will become more apparent from the following detailed description of an exemplary embodiment thereof, as illustrated in the accompanying drawings, in which:

FIGS. 1A–1E are waveforms illustrating an aspect of this invention. FIG. 1A is the reference pulse train waveform to be phase shifted by the phase shifter of the invention. FIG. 1B shows the waveform of FIG. 1A frequency divided by N=4. FIG. 1C shows the same waveform as FIG. 1B except that the frequency division for one cycle is N+1=5 to effect a 90 degree phase shift relative to the waveform of FIG. 1B. FIG. 1D shows the waveform of FIG. 1B upconverted to the frequency of the reference waveform. FIG. 1E shows the waveform of FIG. 1C upconverted to the frequency of the reference waveform.

FIGS. 2A–2E are similar to FIGS. 1A–1E, except that FIG. 2C shows the case with two cycles of division by N+1 to effect a 180 degree phase shift.

FIGS. 3A–3D are waveforms showing the effect of a fixed frequency division following the N, N+1 division illustrated in FIGS. 1A–1E. FIG. 3A shows the reference waveform. FIG. 3B shows the upconverted waveform of FIG. 1E. FIG. 3C shows the reference waveform of FIG. 3A divided by N. FIG. 3D shows the phase shifted waveform of FIG. 3B divided by N, which reduces the phase shift by a factor of 1/N, which for N=4 yields 22.5 degree phase shift.

FIG. 4 is a simplified block diagram of a basic phase shift unit embodying the invention.

FIG. 5 is a block diagram showing one implementation of a local oscillator generator for the phase shift unit of FIG. 4.

DETAILED DESCRIPTION OF THE PREFERRED EMBODIMENT

Figure 6:
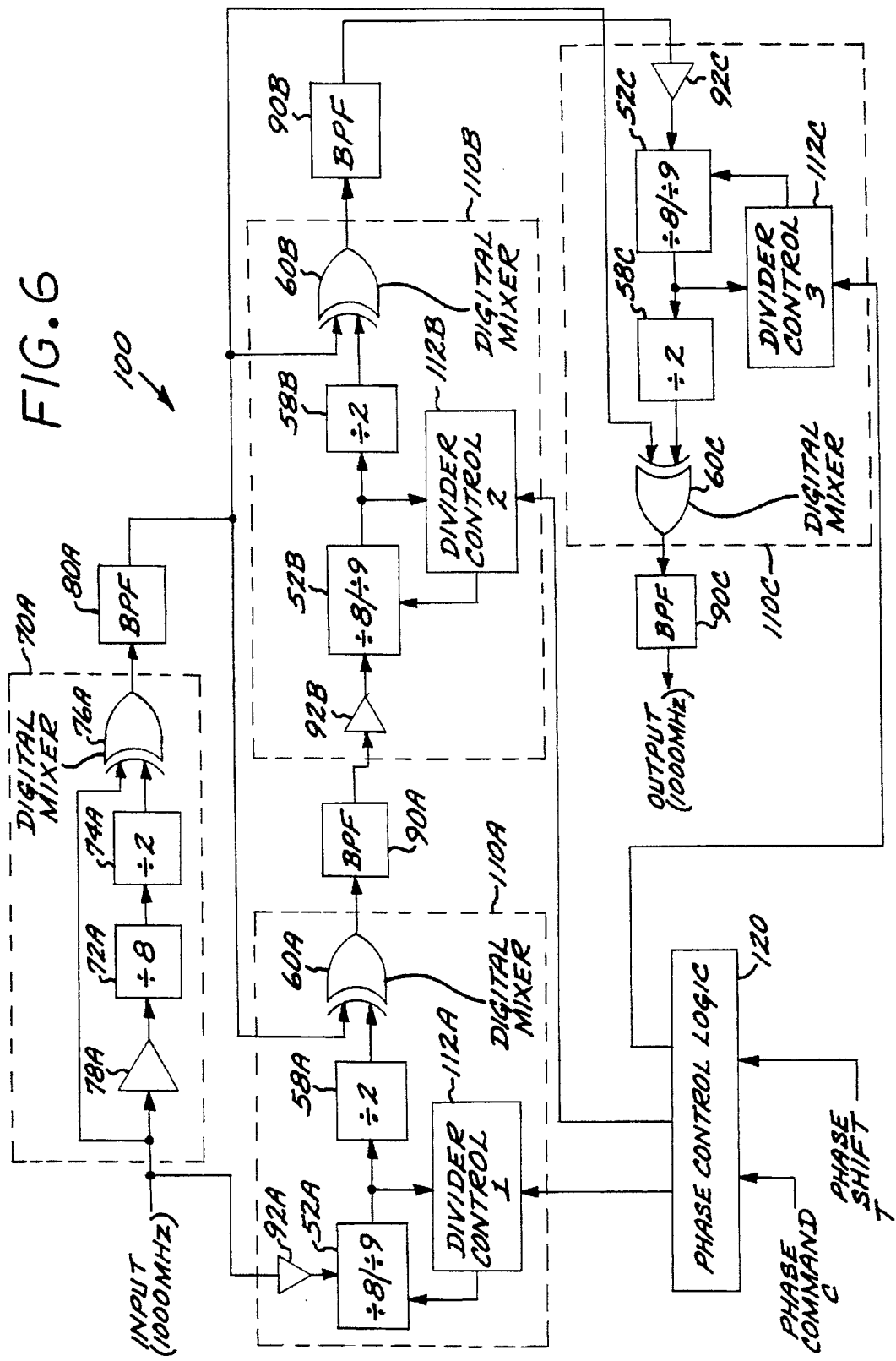
FIG. 6 is a simplified block diagram illustrating an exemplary implementation of a high resolution, multi-stage digital phase shifter architecture in accordance with the invention.

This invention is a digital phase shifter that employs digital circuitry to achieve arbitrarily fine phase control of reference signals at frequencies extending to the Gigahertz region. The architecture of the invention comprises a cascade of identical phase shift elements that provide progressively finer phase control resolution over a full 360 degree range. The phase precision is set by the number of stages used. A three stage design, in an exemplary embodiment, will provide 0.0879 degree precision. Phase switching time for a 1 GHz input signal is less than 50 nanoseconds in an exemplary embodiment. The digital phase shifter embodying the invention inherently has no spurious signal components close to the carrier frequency and in an exemplary embodiment exhibits noise performance below 150 dBc/Hz.

A significant feature of the digital phase shifter of this invention is that the phase resolution is set by the number of identical stages that are cascaded. For the exemplary implementation described herein, a single stage will provide 22.5 degree resolution, and each subsequent stage improves that resolution by a factor of sixteen. The resolution is therefore easily tailored to the needs of a given application.

The digital phase shifter uses a dual modulus frequency divider as the primary phase shifting element. Such frequency dividers divide the input frequency by N or N+Q depending on the state of an input control signal. N can be any integer but is typically in the range of 3 to less than 100. Q is usually 1 or 2, but could be other integers as well as non-integer values. Dual modulus frequency dividers were originally designed for use with two additional programmable counters in frequency synthesis applications to provide programmable integer frequency division factors in unit steps over a wide range.

As used in the phase shifter application, the dual modulus frequency divider and the associated circuitry, described below, do not necessarily alter the input signal frequency but provides arbitrarily fine adjustment of its phase. The basic mechanism for this phase change is shown in FIGS. 1A–1E. FIG. 1A shows the input signal, represented as a pulse train, and FIG. 1B shows that signal divided continuously by N (4 in this example). FIG. 1C shows a similar output except that, for one cycle of division, the dual modulus frequency divider is set to divide by N+1 and then reset to divide by N. As is seen, the output signal is retarded by $1/N^{th}$ of the period of the signal of FIG. 1B. The relative phase shift is 360/N degrees (90 degrees for N=4). If the signal produced by continuous division by N and the signal produced with one cycle of division by N+1 are upconverted to the original input frequency, as shown in FIGS. 1D and 1E, respectively, the phase relationship is preserved.

FIGS. 2A–2E are similar to FIGS. 1A–1E, but show the case with two cycles of division by N+1 division. The relative phase shift is seen to be 2·(360/N), or 180 degrees in this example. In general, each added cycle of division by N+1 will increment an additional 360/N degrees.

FIGS. 3A–3D show the effect of a fixed frequency division following the N, N+1 division shown in FIGS. 1A–1E. Thus, FIG. 3A shows the upconverted waveform of FIG. 1D, and FIG. 3B shows the phase shifted and upconverted waveform of FIG. 1E. FIG. 3C shows the reference waveform of FIG. 3A divided by N (=4 in this example). FIG. 3D shows the phase shifted waveform of FIG. 3B divided by N=4.

The frequency division is accomplished by a digital circuit that is timed off of the rising edge (or falling edge depending on the digital device that is used) of the digital input signal. Consequently, the time delay between pulses of the reference signal of FIG. 3A and the phase shifted signal of FIG. 3B is the same as the delay between the frequency divided reference of FIG. 3C and the phase shifted frequency divided signal of FIG. 3D. The frequency division does, however, increase the pulse repetition period, equal to the reciprocal of the pulse repetition frequency, of the phase shifted and frequency divided signal of FIG. 3D relative to the phase shifted signal of FIG. 3B. The increase in period relative to the delay results in a decrease in the relative phase shift of the signal of FIG. 3D relative to FIG. 3B by the division factor N. Thus, dividing the output of FIG. 3B by 4 will reduce the phase change to 90/4=22.5 degrees. Subsequent frequency upconversion restores the frequency to the input frequency but does not alter the relative phase relationships as discussed previously.

In general, the output phase shift from the combination of a dual modulus frequency divider and a fixed output frequency divider is $$\Delta\Theta = -360 \cdot C/(N \cdot K) \text{ degrees} \quad (1)$$

where N=the primary division factor of the dual modulus frequency divider, C=the number of cycles of N+1 division, and K=the total frequency division factor following the dual modulus frequency divider.

The minimum phase change, or phase resolution, is given by the magnitude of equation 1, with C=1. Correspondingly, phase resolution is $$\Delta\Theta_{resolution} = 360/(N \cdot K) \text{ degrees} \quad (2)$$

The total range of phase control is given by the magnitude of equation 1, with C set to the maximum value to be used, $C_{max}$.

$$\Delta\Theta_{range} = 360 \cdot C_{max}/(N \cdot K) \text{ degrees} \quad (3)$$

An exemplary circuit implementation of the dual modulus frequency divider based phase shifter is shown in FIG. 4. The divider control 160 comprises an R/S flip-flop 62, an AND gate 54 and an n-bit digital counter 56. The n-bit phase control signal C is applied to the parallel load port of the counter 56. This phase control signal determines the number of cycles that the dual modulus frequency divider 52 will divide by N+1. The phase shift strobe is applied to the preset enable port of the counter 56, to initiate the phase change, and is a pulse signal that functions to load the phase control signal into the n-bit digital counter as an initial value. The phase shift strobe also resets the R/S flip-flop to produce a logic-0 output to the ÷N/÷(N+1), dual modulus frequency divider, setting it to divide by N+1. Subsequently, each output pulse from the ÷N/÷(N+1) frequency divider 52 reduces the count value of the digital counter 56 by one. When the digital counter reaches a value of zero, the n complemented Q-bar outputs from the counter 56 will all be logic-1. That input to the n-input AND gate 54 will cause the set input to the R/S flip-flop 62 to be switched to logic-1, setting the R/S flip-flop output to logic-1. The logic-1 input to the ÷N/÷(N+1) frequency divider will cause the frequency division factor to return to division by N. Thus, the ÷N/÷(N+1) frequency divider will divide the input signal frequency by N+1 for the number of cycles commanded by the phase control signal and then revert to division by N.

The divide-by-K divider 58 increases the phase resolution by a factor of K as described above regarding FIGS. 3A–3D, and the mixer 60 upconverts the output of the divider 58 back to the original input frequency. The local oscillator (LO) signal for the mixer 60 is provided by an LO circuit 70, and is derived from the input signal frequency. The LO circuit 70 produces an LO output signal having an LO signal frequency equal to the product of the frequency of the input signal and the factor (KN−1)/KN. The upconverted signal is then passed through a band pass filter 90. The band pass filter 90 functions to pass the desired sum frequency component from the mixer and to reject the difference frequency and any other mixer frequency components. The amplifier 92 establishes the signal power level to that needed to drive the dual modulus frequency divider 52.

FIG. 5 is a simplified schematic block diagram of the LO circuit 70 of FIG. 4. As shown in FIG. 5, the LO to the upconversion mixer 60 can be derived from the input frequency by a circuit 70 having a circuit structure that is similar to the basic phase shift element. Thus, circuit 70 includes a divide-by-N frequency divider 72, a divide-by-K divider 74, a mixer 76, band pass filter 78 and amplifier 80. The mixer LO is in turn the input signal. To maximize commonality of hardware functional elements, the divide-by-N divider of FIG. 5 could be implemented with a dual modulus divide-by-N or divide-by-N+1 divider with the modulus set to constantly divide by N. This would facilitate use of the structure of FIG. 5 as the building block for all stages of a multi-stage phase shifter as well as for the LO generator.

The bandpass filter 78 in this case functions to pass the difference frequency component for the mixer and reject the sum frequency and other unwanted mixer frequency components. The amplifier 80 increases the signal power to the level needed to drive the divide-by-N frequency divider 72.

The fact that the phase shift unit of FIG. 4 has the same input and output frequency facilitates its cascading to provide increased phase resolution. This is illustrated by the simplified schematic block diagram of FIG. 6, showing a high resolution, multi-stage digital phase shifter architecture 100 embodying the invention. The phase shifter 100 includes three stages 110A, 110B and 110C. Stage 110A includes an input amplifier 92A, a dual modulus frequency divider 52A, which performs either a divide-by-8 or divide-by-9 function, a divide-by-2 frequency divider 58A, a divider control circuit 112A and a digital mixer 60A. The output of mixer 60A is passed through band pass filter 90A, and into the input of stage 110B.

Stage 110B includes similar elements, i.e., an input amplifier 92B, a dual modulus frequency divider 52B, a frequency divider 58B, a digital mixer 60B and a divider control circuit 112B. The second stage mixer 60B output is passed through band pass filter 90B into the third stage 110C. Stage 110C includes corresponding elements including an input amplifier 92C, a dual modulus frequency divider 52C, a frequency divider 58C, a mixer 60C and a divider control circuit 112C. The third stage mixer 60C output is passed through a band pass filter 90C.

The frequency of the signal output from the dual modulus frequency divider 52A undergoes a total frequency division of 512 (2×8×2×8×2) following the dual modulus frequency divider 52A. This is the frequency division resulting from dividers 58A, 58B and 58C, and from dual modulus frequency dividers 52B and 52C operating in a divide-by-8 mode. From equation 1, the resolution of this first stage of the phase shift is $$\Delta\Theta_{resolution(1)} = 360/(8\cdot 512) = 0.08789 \text{ degrees}$$

Subsequent stages 110B and 110C are followed by progressively less frequency division to provide the following phase resolutions. The calculation of the second stage 110B phase resolution follows from equation 2:

N=8

K=2×8×2=32

$\Delta\Theta_{resolution(2c)} = 360/(8\times 32) = 1.40625$ degrees

The calculation of the third stage 110C phase resolution follows:

N=8

K=2

$\Delta\Theta_{resolution(3)} = 360/(8\times 32) = 22.5$ degrees

The phase control range of each of the three stages is given below, from equation 3 with $C_{max}=15$.

The first stage 110A phase control range is:

N=8

K=2·8·2·8·2=512

$\Delta\Theta_{range(1)} = 360\cdot C_{max}/(N\cdot K) = 360\cdot 15/(8\cdot 512) = 1.31836$ degrees The second stage 110B phase control range is:

N=8

K=2·8·2=32

$\Delta\Theta_{range\ (2)} = 360\cdot C_{max}/(N\cdot K) = 360\cdot 15/(8\cdot 32) = 21.09375$ degrees The third stage 110C phase control range is:

N=8

K=2

$\Delta\Theta_{range(3)} = 360\cdot C_{max}/(N\cdot K) = 360\cdot 15/(8\cdot 2) = 337.5$ degrees The total phase control range of the exemplary three stage phase shifter is given by the sum of the ranges of the three stages as $$\Delta\Theta_{total} = 1.31836 + 21.09375 + 337.5 = 359.91211 \text{ degrees}$$

which is one fine phase resolution step (0.08789 degrees) less then 360 degrees. Because 360 degrees of phase shift is identically the same as zero degrees, the exemplary multistage phase shifter provides complete coverage of 360 degrees range in 0.08789 degree steps.

The LO signal for the digital mixers 60A, 60B and 60C is provided by circuit 70A, comprising the amplifier 78A frequency divider 72A, frequency divider 74A and digital mixer 76A. The output of the circuit 70A is passed through a band pass filter 80A to provide a LO signal having a frequency equal to 937.5 MHz, for an input signal frequency of 1000 MHz.

FIG. 6 also shows the use of an exclusive OR gate as a digital mixer 60A, 60B, 60C and 76A. When the LO signal input is logic-0, the output of the mixer, i.e., the exclusive OR gate, is equal to the other gate input, and when the LO input is logic-1, the output is the input inverted. This is essentially the same functionality of a double balanced diode mixer. Use of the exclusive OR gate facilitates its integration with the preceding digital functions.

The digital phase shifter 100 is ideally fabricated with the functions of stages 110A, 110B, 110C and 70A implemented as application specific integrated circuits (ASICs) or full custom integrated circuits (ICs). The band pass filters (BPF) 80A, 90A, 90B, 90C between each stage are external to the ICs. The phase control logic 120, which derives the control signals to the divider control 1, 2, and 3 functions 112A, 112B and 112C from the input phase command could also be a gate array.

The phase control logic 120 functions in response to the input phase command to determine the number of frequency division cycles by N+1 (N+1=9 in the exemplary three stage configuration) for each of the stages 110A, 110B, and 110C of the phase shifter to achieve the commanded phase shift. On the occurrence of a phase shift trigger pulse signal, the three multi-bit digital outputs from the phase control logic 120 are input to the divider control 1, divider control 2, and divider control 3 circuits 112A, 112B, and 112C. The divider control circuits are fundamentally digital counters, logic AND gates, and R/S flip-flops as shown in an exemplary configuration in FIG. 4, that on the occurrence of commanded phase changes, are preset to initial counter values that correspond to the numbers of cycles of frequency division by N+1 needed for each stage 110A, 110B, and 110C of the phase shifter. For each stage of the phase shifter, the action of commanding the phase shift resets the R/S flip-flop output to logic 0, setting the dual modulus frequency divider 52A, 52B and/or 52C to divide by N+1. Each output pulse from the frequency dividers decrements the counters by one. As the counter outputs reach zero, the complemented outputs from the counters become all logic 1. The AND gate outputs then switch to logic 1, setting the R/S flip-flop outputs to logic 1, and the dual modulus frequency dividers revert to the frequency division by N.

In addition to precise phase control, the disclosed phase shifter as implemented in the exemplary configuration of FIG. 6 is inherently spurious signal free inside the region around the carrier frequency extending out to plus or minus the input frequency $f_{input}$ divided by N·K. That feature results from the fact that $f_{input}/(N\cdot K)$ is the lowest common frequency factor for all frequencies in the phase shifter. For the exemplary phase shifter with the input frequency equal to 1000 MHz, N=8, and K=2, the spurious free regions extend plus or minus 62.5 MHz from the output signal carrier.

It should be noted that although the exemplary configurations of FIGS. 4 and 6 provide an output frequency that is equal to the input frequency, other configurations using LO frequencies that do not produce equal input and output frequencies do not depart from the primary purpose and functionality of the disclosed invention, and could also be employed.

The digital phase shifter in accordance with this invention can also provide fine, sub-nanosecond sample timing adjustments needed for precision digital timing applications. Conventional approaches generally shift the timing in increments of the system clock for coarse control (typically about 100 MHz, so that coarse timing is in 10 nanosecond increments); fine control in nanosecond increments is provided rather imprecisely by a tapped delay line. A phase shifter in accordance with this invention can provide precise digitally clocked timing in increments as small as 2 picoseconds, in an exemplary embodiment, for a 100 MHz clock.

Instead of using N as the primary division factor and N+1 as the division factor used to effect the phase shift, N+1 may be used as the primary division factor and N as the division factor used to effect the phase change. In this case, the resulting phase shift will be a phase advance rather than a phase retard.

Instead of using N and N+1 integer division factors, N and N+P factors can be used, where N and P may be any integer or non-integer values and where either N or N+P is used as the primary frequency division factor, without departing from the scope of this disclosure.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A digital phase shifter for phase shifting an output signal:

a dual modulus frequency divider for dividing the frequency of an input signal by a selectable modulus value of a first modulus value N and a second value N+P, wherein N and P are integers, said dual modulus frequency divider providing a dual modulus frequency divider output signal having a frequency equal to the frequency of the input signal divided by N or N+P;

a frequency divider for dividing said dual modulus frequency divider output signal by a division factor, wherein said frequency divider provides a frequency divider output signal having a frequency equal to the frequency of said dual modulus frequency divider output divided by said division factor;

upconverting means for receiving said frequency divider output signal and frequency upconverting said frequency divider output signal to provide an upconverted signal as said output signal; and means responsive to a phase control command specifying a phase shift value for selecting said selectable modulus value of said dual modulus frequency divider, said modulus selecting means operable to select one of said first or second modulus values as a primary modulus value for said dual modulus frequency divider, said modulus selecting means further operable to select another one of said first or second modulus values to which said dual modulus frequency divider is set only for a number of cycles of division of said dual modulus frequency divider to effect said phase shifting of said output signal relative to a first phase of said output signal, said number determined in dependence on said phase control command, wherein a second phase of said output signal is phase shifted relative to said first phase of the output signal.

2. The phase shifter of claim 1 wherein said upconverting means comprises a mixer for mixing said frequency divider output signal with a local oscillator (LO) signal to produce said upconverted signal.

3. The phase shifter of claim 1 further comprising a band pass filter for filtering said upconverted signal to filter out undesirable mixer products.

4. The phase shifter of claim 2 further comprising an LO signal generating circuit, said generating circuit comprising means for deriving said LO signal from said input signal.

5. The phase shifter of claim 4 wherein said deriving means comprises LO circuit frequency dividing means for dividing the frequency of the input signal by a factor NK to provide an LO frequency divider signal having a frequency equal to said input signal frequency divided by NK, and LO mixing means for mixing said LO frequency divider signal with said input signal to provide an LO mixer output signal, and band pass filtering means for filtering said LO mixer output signal to provide said LO signal.

6. The phase shifter of claim 4 wherein said deriving means provides an LO signal having a frequency equal to the product of the frequency of the input signal and a factor (KN−1)/KN, where K is a value representing said division factor of said frequency divider.

7. The phase shifter of claim 2 wherein said mixer comprises an Exclusive OR logic gate having first and second inputs, and wherein said first input is said LO signal and said second input is said frequency divider output signal.

8. The phase shifter of claim 1 wherein said primary modulus value is said first modulus value N, and said another one to which said dual modulus frequency divider is set for a number of cycles of division to effect said phase shifting of said input signal is said second modulus value N+P, wherein said phase shifting is a phase retardation of said second phase of said output signal relative to said first phase.

9. The phase shifter of claim 1 wherein said primary modulus value is said second modulus value N+P, and said another one to which said dual modulus frequency divider is set for a number of cycles of division to effect said phase shifting of said input signal is said first modulus value N, wherein said phase shifting is a phase advancing of said second phase of said output signal relative to said first phase.

10. The phase shifter of claim 1 wherein said means for selecting said modulus value comprises a digital counter circuit which is settable by said phase control command to count said number of cycles of division.

11. The phase shifter of claim 1 wherein said input signal is a periodic pulse train.

12. The phase shifter of claim 1 wherein P is equal to one.

13. The phase shifter of claim 1 wherein said upconverting means provides an upconverted signal having a frequency equal to the frequency of the input signal.

14. A multi-stage digital phase shifter for phase shifting an output signal, comprising a cascaded arrangement of digital phase shift circuit units, each unit comprising an input port and an output port and providing a unit output signal, each unit providing phase shifting of a second phase of said unit output signal relative to a first phase of said output signal, and wherein an output port of a first unit is connected to an input port of a next unit in said cascaded arrangement, so that signals phase shifted by said first unit are propagated through said next unit and phase shifted by said next unit, and wherein each said phase shifter unit comprises a dual modulus frequency divider for dividing the frequency of an input signal by selectable modulus value of a first modulus value N or a second modulus value N+P, wherein N and P are integers, said frequency divider providing a dual modulus divider output signal having a frequency equal to the frequency of the input signal divided by N or N+P;

a frequency divider for dividing said dual modulus divider output signal by a division factor, wherein said frequency divider provides a frequency divider output signal having a frequency equal to the frequency of said dual modulus frequency divider output divided by said division factor;

upconverting means for receiving said output signal and frequency upconverting said frequency divider circuit to provide an upconverted signal as said unit output signal; and means responsive to a phase control command specifying a phase shift value for selecting said selectable modulus value of said dual modulus frequency divider, said modulus selecting means operable to select one of said first or second modulus values as a primary modulus value, said modulus selecting means operable to select another one of said first or second modulus values to which said dual modulus frequency divider is set only for a number of cycles of division to effect said phase shifting of said output signal, said number determined in dependence on said phase control command.

15. The phase shifter of claim 14 wherein said upconverting means comprises a mixer for mixing said frequency divider signal with a local oscillator (LO) signal to produce said upconverted signal.

16. The phase shifter of claim 14 further comprising a band pass filter for filtering said upconverted signal to filter out undesirable mixer products.

17. The phase shifter of claim 15 further comprising an LO signal generating circuit, said generating circuit comprising means for deriving said LO signal from said input signal.

18. The phase shifter of claim 17 wherein said deriving means comprises LO circuit frequency dividing means for dividing the frequency of the input signal by a factor NK to provide an LO frequency divider signal having a frequency equal to said input signal frequency divided by NK, where K represents said frequency division ratio of said frequency divider, and LO mixing means for mixing said LO frequency divider signal with said input signal to provide an LO mixer output signal, and band pass filtering means for filtering said LO mixer output signal to provide said LO signal.

19. The phase shifter of claim 17 wherein said deriving means provides an LO signal having a frequency equal to the product of the frequency of the input signal and a factor (KN−1)/KN.

20. The phase shifter of claim 15 wherein said mixer comprises an Exclusive OR logic gate having first and second inputs, and wherein said first input is said LO signal and said second input is said frequency divider output signal.

21. The phase shifter of claim 14 wherein said primary modulus value is said first modulus value N, and said another one to which said dual modulus frequency divider is set for a number of cycles of division to effect said phase shifting of said input signal is said second modulus value N+P, wherein said phase shifting is a phase retardation of said second phase of said output signal relative to said first phase.

22. The phase shifter of claim 14 wherein said primary modulus value is said second modulus value N+P, and said another one to which said dual modulus frequency divider is set for a number of cycles of division to effect said phase shifting of said input signal is said first modulus value N, wherein said phase shifting is a phase advancing of said second phase of said output signal relative to said first phase.

23. The phase shifter of claim 14 wherein said means for selecting said modulus value comprises a digital counter circuit which is settable by said phase control command to count said number of cycles of division.

24. The phase shifter of claim 14 wherein said input signal is a periodic pulse train.

25. The phase shifter of claim 14 wherein M is equal to one.

26. The phase shifter of claim 14 wherein said upconverted signal has a frequency equal to the frequency of the input signal.

* * * * *